United States Patent [19]
Ayers

[11] Patent Number: 5,801,092
[45] Date of Patent: Sep. 1, 1998

[54] METHOD OF MAKING TWO-COMPONENT NANOSPHERES AND THEIR USE AS A LOW DIELECTRIC CONSTANT MATERIAL FOR SEMICONDUCTOR DEVICES

[76] Inventor: Michael R. Ayers, 632 Kearny St. #6, El Cerrito, Calif. 94530

[21] Appl. No.: 923,490

[22] Filed: Sep. 4, 1997

Related U.S. Application Data

[60] Provisional application No. 60/040,323 Feb. 14, 1997.

[51] Int. Cl.$^6$ .................................................. H01L 21/31
[52] U.S. Cl. ........................... 438/623; 438/624; 438/778; 438/781; 427/96; 427/204; 427/214
[58] Field of Search ........................ 438/624, 623, 438/763, 781, 782, 780, 778, 790, 395; 148/DIG. 81; 427/96, 193, 189, 204, 214, 215, 220, 213.33, 213.34, 216

[56] References Cited

U.S. PATENT DOCUMENTS

| 4,652,467 | 3/1987 | Brinker | 427/246 |
|---|---|---|---|
| 4,849,284 | 7/1989 | Arthur | 428/325 |
| 4,865,875 | 9/1989 | Kellerman | 427/96 |
| 4,987,101 | 1/1991 | Kaanta | 286/443 |
| 4,994,302 | 2/1991 | Kellerman | 427/96 |
| 5,055,342 | 10/1991 | Markovich et al. | 428/137 |
| 5,103,288 | 4/1992 | Sakamoto | 357/71 |
| 5,149,590 | 9/1992 | Arthur | 428/421 |
| 5,354,611 | 10/1994 | Arthur et al. | 428/325 |
| 5,453,293 | 9/1995 | Beane et al. | 427/96 |
| 5,470,802 | 11/1995 | Gnade | 437/238 |
| 5,494,858 | 2/1996 | Gnade | 437/231 |
| 5,494,859 | 2/1996 | Kapoor | 437/235 |
| 5,504,042 | 4/1996 | Cho | 437/247 |
| 5,561,318 | 10/1996 | Gnade | 257/638 |
| 5,614,250 | 3/1997 | Diener et al. | 427/96 |

FOREIGN PATENT DOCUMENTS

| 6-097298 | 4/1994 | Japan | 438/395 |
|---|---|---|---|
| 7-112126 | 5/1995 | Japan | |

OTHER PUBLICATIONS

R. E. Geer; D. A. Stenger; M. S. Chen; J. M. Calvert; R. Shashidhar; Y. H. Jeong; P. S. Pershan; Langmuir; X–ray and Ellipsometric Studies of Self–Assembled Monolayers of Fluorinated Chlorosilanes; Apr. 1, 1994; 6pgs.

*Primary Examiner*—Charles L. Bowers, Jr.
*Assistant Examiner*—Matthew Whipple

[57] ABSTRACT

This invention provides a process for making an insulation layer for use in microelectronic devices, whereby capacitive coupling and propagation delay in the microelectronic devices are reduced. This invention can include the formation of a stable solution of spherical particles consisting of a ceramic core 10 and a non-polar coating 20. This solution can be applied to an microelectronic substrate, and dried to form a continuous, porous layer. Novel methods are disclosed for bonding these particles together into an integral layer. Porous layers formed by the process of this invention possess a very low dielectric constant, and can be produced using equipment and techniques common and available to those skilled in the art of microelectronic fabrication.

14 Claims, 4 Drawing Sheets

METHOD OF MAKING TWO-COMPONENT NANOSPHERES AND THEIR USE AS A LOW DIELECTRIC CONSTANT MATERIAL FOR SEMICONDUCTOR DEVICES

FIELD OF THE INVENTION

This invention relates generally to the fabrication of dielectric layers on semiconductor devices, and more specifically to methods for forming these from two-component nanospheres that will reduce the line capacitance of integrated circuits, and therefore improve their power consumption and delay time.

BACKGROUND OF THE INVENTION

Microelectronic integrated circuits based on patterned semiconductor materials are continuing to evolve towards devices with an extremely high density of circuit elements per unit volume. As the features of these devices are reduced to smaller sizes, the performance of the various materials that constitute the device will critically determine their success. One specific area in need of advancement is the electrical insulator used between the wires, metal lines, and other elements of the circuit. As the distances between the circuit elements become smaller, there will be increased problems due to capacitive coupling (crosstalk) and propagation delay. These difficulties can be avoided by preparing the circuit using an insulating material that possesses a dielectric constant as low as possible. It has been conventional prior art and practice in this field to use dense materials such as silicon dioxide, silicon nitride, and various organic polymers as insulators. However, the dielectric constants of these materials range from 3.0–7.0 which will not be adequate for future circuits. The success of future circuits will depend on the development of materials with dielectric constants of less that 2.0, and approaching the limiting value of an air gap (1.0). As there are as yet no fully dense materials with a dielectric constant less than 2.0 (2.1 for polytetrafluoroethylene), considerable effort has been focused towards the development of porous dielectric materials. These can be thought of as composite materials, with the value of their dielectric constants intermediate between that of air and the solid phase.

U.S. Pat. No. 4,987,101, issued to Kaanta, et al. on Jan. 22, 1992 describes a process to prepare fully porous (air gap) structures by depositing a removable material in the critical area of the device, applying a solid cap to this material, and removing the temporary filler through holes bored in the cap. This requires several difficult process steps to completely eliminate all material from the desired areas. Additionally, there would be no mechanical support provided by the air gap. This could lead to deformations of the circuit as the device is cycled through high temperatures in subsequent processing steps.

U.S. Pat. No. 5,103,288 issued to Sakamoto and Hamano on Apr. 7, 1992 describes depositing an intimate mixture of metal oxides on a semiconductor wafer, one or more of which can be removed by chemical means. Extraction of the desired oxide components would leave a porous matrix of the remaining oxide. However, the available oxides that can be easily removed (sodium oxide, calcium oxide, etc.) contain cations that are generally considered to be impurities in semiconductor devices. Furthermore, the there is a high probability that there will be incomplete removal of the desired oxide in this process which would adversely affect the dielectric performance of the material.

U.S. Pat. No. 5,494,859 issued to Kapoor on Feb. 27, 1996 describes a similar process whereby a composite material is deposited on a wafer by chemical vapor methods. This composite contains at least one component that can be removed by themochemical processing, thereby leaving the remaining portion of the composite as a porous layer. This process suffers from the rather expensive vacuum processing equipment needed for deposition of the composite and the high temperatures required to remove the unwanted portion.

The most common approach taken to achieve porous films on semiconductor wafers draws upon the methods of sol-gel chemistry. These methods typically employ the hydrolysis and condensation reaction of metal or metalloid alkoxides to form a gel containing a continues solid phase of the corresponding metal or metalloid oxide. This is filled with the solvent and other liquid reactants used in the process which must be removed to achieve a porous solid matrix. This well-developed process produces porous materials with fine particle sizes (2–10 nm) and very high porosities (70–99%). U.S. Pat. No. 4,652,467 issued to Brinker et al., on Mar. 24, 1987 describes preparing such a gel of silicon oxide. This gel is then dried by evaporative methods yielding a film of pure silicon dioxide. However, there is significant shrinkage resulting from the further condensation reaction of the silica particles as the gel structure is drawn together by the surface tension of the evaporating liquids. This leads to high density films and increases their dielectric constant. A method to avoid the problem of gel shrinkage during drying has been developed by Gnade, et al. and Cho, et al. and described in U.S. Pat. No. 5,470,802 (issued Nov. 28, 1995), U.S. Pat. No. 5,494,858 (issued Feb. 27, 1996), U.S. Pat. No. 5,504,042 (issued Apr. 2, 1996), and U.S. Pat. No. 5,561,318 (issued Oct. 1, 1996). This process involves a further chemical derivitization of the silicon dioxide surface with an unreactive organic group. This prevents condensation reactions as the gels shrink, and allows low density materials to be prepared by evaporative drying. These sol-gel processes necessitate that several chemical reactions be performed after the alkoxide precursor solution has been applied to the wafer. This leads to difficulties of reproducibility and low throughput. Additionally, as the dielectric constant of porous silicon dioxide varies linearly with porosity (from 3.9 at full density, to 1.0 at full porosity) a very high porosity will be needed to achieve dielectric constants less than 2.0. This fact, and the random nature of the gelation process, increase the likelihood of encountering extremely large pores that would be detrimental to circuit fabrication.

Therefore, to provide a low dielectric constant layer with a moderate to low porosity, there is a significant need to develop porous materials whose fundamental (fully dense) dielectric constant is significantly lower than pure silicon dioxide. Additionally, there is a need for such a material that can be easily deposited on semiconductor wafers with standard wafer processing techniques.

SUMMARY OF THE INVENTION

The limitations of the prior art discussed above have, as of yet, not allowed the use of porous materials in semiconductor devices. Several of these limitations are overcome or alleviated by the present invention which provides a route to the preparation of a two-component nanospherical material with improved electrical properties, and methods for their deposition onto semiconductor wafers. In accordance with the present invention, a solution is prepared that contains small particles (preferably less than 30 nm in diameter, and more preferably 2–10 nm in diameter) of a ceramic material (preferably silicon dioxide) that are coated with a self-assembled monolayer (preferably <5 nm thick, and more preferably 1 nm thick) of a non-polar material with high temperature stability. Ideally, the monolayer coating will also lower the dielectric constant of the suspended particles. For this purpose, perfluoroalkyl, or partially-fluorinated alkyl groups are the preferred coating. These nanospheres are deposited onto a semiconductor wafer as a disordered macrocrystal having a porosity ranging from 80% to ~25% (minimum value for closest-packed spheres). This deposit provides an insulating layer with a low dielectric constant (less than 3.0, and preferably less than 2.0). According to the present invention, the deposited spheres are then cured in place which crosslinks the organic coating and improve the mechanical properties of the layer. Additionally, this invention provides a method to improve the adhesion of these particles to semiconductor wafers by applying a monolayer similar to the coating of the nanospheres onto the wafer surface prior to deposition.

A critical feature of the present invention is that the insulating layer produced by the nanosphere macrocrystal can be deposited using conventional film deposition techniques without extraordinary chemical processing. A difficulty inherent in depositing films by the sol-gel process arises from the chemical reactions that must occur after the initial deposition on the substrate. These include the hydrolysis and condensation reactions leading to the formation of the gel, and any further derivitization required to chemically modify the surface of the gel. To achieve reproducible results these reactions must be carried out under precisely controlled conditions and may require long reaction or aging times. A further disadvantage to this process results from the instability of the precursor solutions used for these films. These solutions typically consist of partially condensed silicon alkoxides that are unstable toward further condensation with a concurrent increase in solution viscosity. This will further complicate the deposition of films with a reproducible thickness. The present invention avoids these concerns by performing virtually all chemical processing prior to the deposition on the wafer. According to this invention, two-component nanospheres are prepared that exist as monodisperse particles in solutions that are stable indefinitely. These solutions can then be applied to wafers as thin films using standard deposition techniques such as spin-coating, spray coating, or dip coating. As solvent evaporates from the film, the nanospheres crystallize onto the wafer surface, with the degree of crystalline disorder determining the final porosity of the film.

A further critical advantage of this invention results from the ability to modify the dielectric constant of the final film in at least two controllable ways. The first of these is the variation of the fundamental dielectric constant of the particles with changing ratios of oxide core and outer coating. The dielectric constant of a certain material decreases linearly with increasing porosity approaching a value of 1.0 for 100% porosity. Porous materials derived from sol-gel processes typically consist of a material with a relatively high fundamental dielectric constant (3.9 for $SiO_2$) and, therefore, must be made with a relatively high 50–80% porosity. The present invention uses two-component nanospheres, where one component is a refractory oxide ($SiO_2$) and the second is a non-polar group. The fundamental dielectric constant of these particles will therefore be the sum of the dielectric constants of these two components. This principle has been demonstrated by Arthur, et al. (U.S. Pat. No. 4,849,284 issued on Jul. 18, 1989; and U.S. Pat. No. 5,149,590 issued on Sep. 22, 1992) in the production of dense composite materials as substrates for printed circuit boards. These composites possessed a dielectric constant (2.8) that was intermediate between their two components: 50% SiO2 (3.9), and 50% PTFE (2.1). In the present invention, the application of the non-polar coating to the particle typically adds 2 nm to the overall diameter of the particle. Therefore, by varying the diameter of the oxide core, it is possible to control the ratio of non-polar coating to oxide (and consequently, the fundamental dielectric constant of the material). For example a 10-nm diameter silica particle coated with a 1-nm thick layer of non-polar material would have a silica content of 51% by volume, while a 5-nm diameter silica particle coated with a similar layer would have a silica content of only 36%. This allows the dielectric constant of the individual particles to be targeted by controlling the particle size. Furthermore, as the dielectric constant of the particles will be lower than that of pure silica, the same bulk dielectric constant can be obtained with a lower porosity relative to pure silica.

The second method for controlling the dielectric constant inherent in the present invention is the control of the crystalline order (porosity) of the deposited films. Uniform spheres have a maximum packing density of 75% (25% porosity). For this case, the dielectric constant of the film would be 75% of the fundamental value. However, ideal packing is difficult to achieve under the best of circumstances and deposited films will likely have higher porosities. However, as this also decreases the dielectric constant of the film, this can be exploited to produce a high performance film. The present invention considers several methods to control the crystalline order of the film, including but not limited to, control of the rate of solvent evaporation during deposition, control of the temperature of deposition, the concentration of nanospheres in the deposition solution, and addition of a specific amount of nanospheres with slightly larger, or smaller, diameters than the majority. The ability to modify the dielectric constant of the films in two ways is a fundamental advantage of this invention.

Further advantages of the present invention are the simple techniques used to promote adhesion and mechanical strength of the films. Adhesion can be greatly enhanced by soaking the wafers in a solution that forms a self-assembled monolayer of the same non-polar material used to coat the nanospheres. This is conveniently accomplished prior to the deposition of the nanospheres as disclosed by Geer, et al. "X-ray and Ellipsometric Studies of Sel-Assembled Monolayers of Fluorinated Chlorosilanes", Langmuir, 10 (1994), pp. 1171–1176. The same affect can be accomplished by treating the wafer with this non-polar material through the vapor phase. The mechanical properties of the deposited films can be enhanced by any of several techniques capable of initiating crosslinking of the coating layer of the nanospheres. These include, but are not limited to thermal annealing, ultraviolet irradiation, treatment with ionizing radiation (x-rays, gamma rays, etc.), plasma treatment, electron beam processing, or a combination of these methods. These treatments can be enhanced by the addition of low molecular weight species to the precursor solution that will concentrate near the junction of individual particles and increase the amount of crosslinking at that point.

The above-discussed and other features and advantages of the present invention will be apparent to and understood by those skilled in the art from the following detailed description and drawings.

DETAILED DESCRIPTION OF THE PREFERRED EMBODIMENTS

The two-component nanosphere material of the present invention which is well suited for forming electrical insulating layers in semiconductor integrated circuits comprises a refractory oxide core coated with a non-polar material; the nanospheres prepared in this way having a low dielectric constant, low moisture uptake at ambient and elevated temperatures, high thermal stability, and high chemical resistance. The nanospheres prepared according to the present invention are monodisperse and are of a size that allows them to fill the topographical features of a patterned semiconductor wafer. The present invention also teaches methods for improving the adhesion and mechanical properties of the nanospheres on said wafers. The preferred oxide core, which can be simply prepared as monodisperse spheres of the appropriate size, is silicon oxide ($SiO_2$).

The non-polar coating added to the oxide spheres serves several purposes, it should; render the surface of the spheres hydrophobic, maintain this moisture resistance at elevated temperatures (preferably above 300° C., and more preferably from 400°–500° C.), lower the overall dielectric constant of the individual spheres (preferably below 3.0, and more preferably at or below 2.5), add a known thickness to the total sphere diameter (preferably less than 2.0 nm and more preferably from 0.5–1.0 nm), contain a hydrolyzable group capable of permanently bonding the coating to the oxide sphere (preferably a halosilane or more preferably an alkoxysilane) and, be capable of bonding the spheres together after an appropriate thermal or physical treatment. The preferred materials that meet the above requirements have the general formula $X_3SiCH_2CH_2(CF_2)_nF$, where $X=Cl, Br, CH_3O-$, other alkoxide, or preferably $CH_3CH_2O-$, and $n=0-12$, or preferably 6, 8, or 10. These materials are available commercially from Harris Specialty Chemicals, PCR division, and Hüls America, Inc. with varying chain lengths, or as mixtures of several chain lengths. However any material which satisfies the requirements outlined above may be utilized in the present invention.

Figure 1:
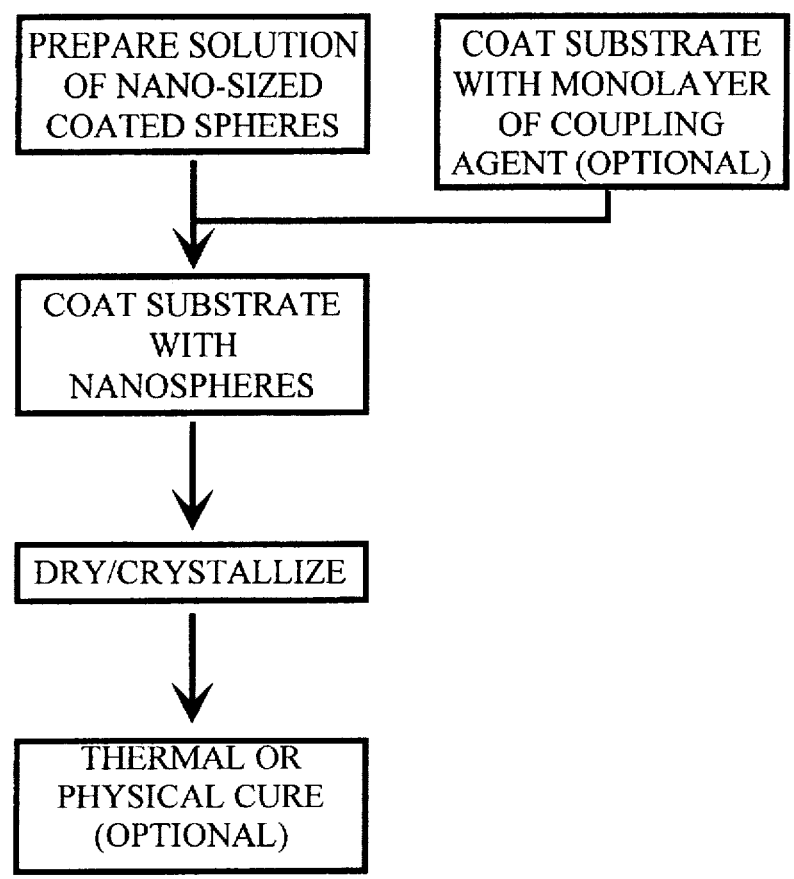
FIG. 1 shows a block diagram of the process steps in a typical embodiment of the invention.

The process steps involved in depositing a thin layer of coated nanospheres according to the present invention are outlined FIG. 1. In the preferred embodiment of this invention, the oxide core of the nanospheres are prepared by the hydrolysis and condensation of an alkoxide, preferably tetramethylorthosilicate, or more preferably, tetraethylorthosilicate (TEOS). The conditions of the hydrolysis and condensation (namely alkoxide concentration, water content, and pH) are controlled such that the desired particle size of the resultant oxide is achieved and that the particles remain monodisperse and in solution. In the preferred embodiment the volume ratios of the reagents, acetone, water, TEOS, and 30% aqueous ammonia are; 50.0:0.83:1.0:0.76. This results in a stable solution of silica particles with diameters of ~10–20 nm.

Figure 2:
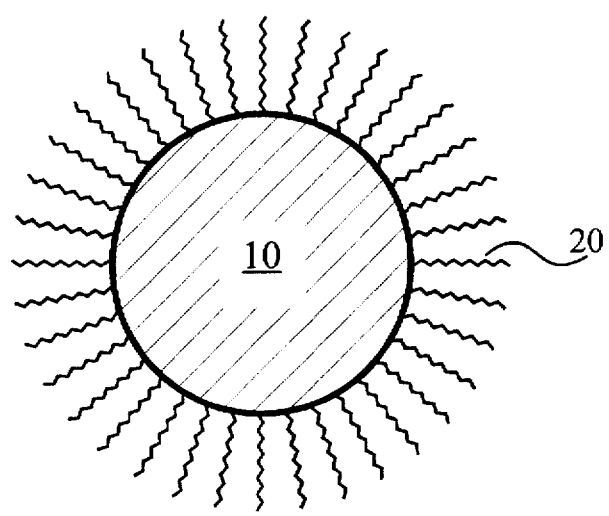
FIG. 2 is a cross-sectional representation of a nanosphere prepared in a typical embodiment of the invention.
Figure 3A:
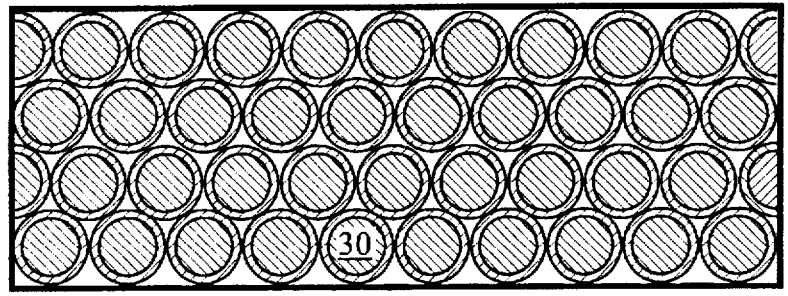
FIGS. 3A–3C show various possible packing arrangements for the nanospheres prepared in an embodiment of the invention, and the effect of packing density on the porosity of the material.
Figure 3B:
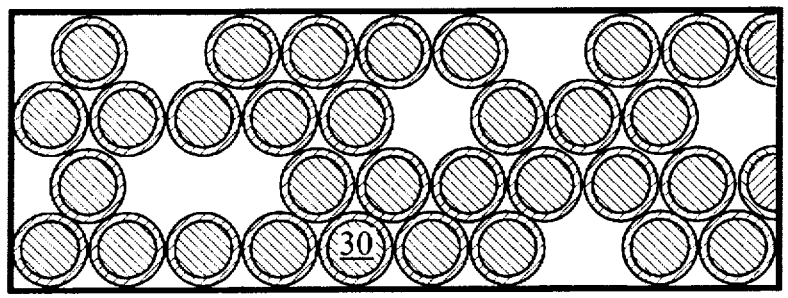
Figure 3C:
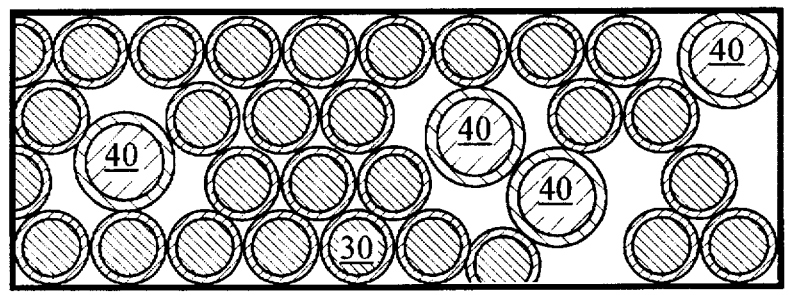

The silica particles thus prepared are then coated with the fluorocarbon coating by adding an acetone solution of the desired coating agent (as described above) with the appropriate amount to form a self-assembled monolayer on the oxide core surface. FIG. 2 shows the arrangement of the oxide core, 10, and the fluorocarbon coating, 20. The chains of the fluorocarbon are arranged so as to maximize their interactions with each other radiating from the center of the particle, thereby forming a spherical coating around the oxide core. Fluorocarbon chains of 10 carbons in length add approximately 1 nm to the thickness of each side of the sphere (2 nm to the diameter). The preferred solvent for this synthesis is acetone, however, any solvent, or mixture of solvents, that meet the above requirements may be used.

In an alternate embodiment of this invention, the formation of the oxide core and the fluorocarbon coating are prepared simultaneously. This is accomplished by performing the reaction in a solvent with a high affinity for the fluorocarbon portion of the coating agent (preferably a halocarbon, or more preferably a fluorocarbon). This causes the formation of reverse micelle structures with the polar species (water, alkoxides, catalysts) at the center of the structure, where the reactions that forms the oxide core then occur. This embodiment may be assisted by an appropriate phase-transfer agent, by homogenization with ultrasonics, or by any other method that enhances the miscibility of the solvent system.

The solution of nanospheres prepared according to the above embodiments are then ready for deposition onto the desired substrate. However, when a coating of nanospheres is desired on a semiconductor wafer, a pretreatment step may be desired. Typical semiconductor wafers possess thin coatings of metal oxides over the silicon, aluminum, tungsten, copper or other metals used in the device. These oxide layers commonly support a large number of hydroxyl groups at the exterior surface. These polar groups may show a low affinity for the fluorocarbon coating of the nanospheres described in this invention. However, this surface is amenable to the same type of coating process as described above for coating oxide spheres, namely the use of a fluoroalkylsilane such as, $X_3SiCH_2CH_2(CF_2)_nF$, where $X=CH_3O-$, $CH_3CH_2O-$, other alkoxide, or preferably Cl, or Br, and $n=0-12$, or preferably 6. This is conveniently accomplished by soaking the wafer in a solution of the above mentioned silane in an anhydrous, aprotic solvent (preferably toluene, chloroform, ethyl ether, or a similar solvent) The concentration of the silane in the soaking solvent is preferably 1–10%. This coating may also be deposited through the vapor phase. However, if the adhesion properties of the coated nanospheres are deemed to be acceptable to a particular substrate, this step may be omitted.

Figure 4:
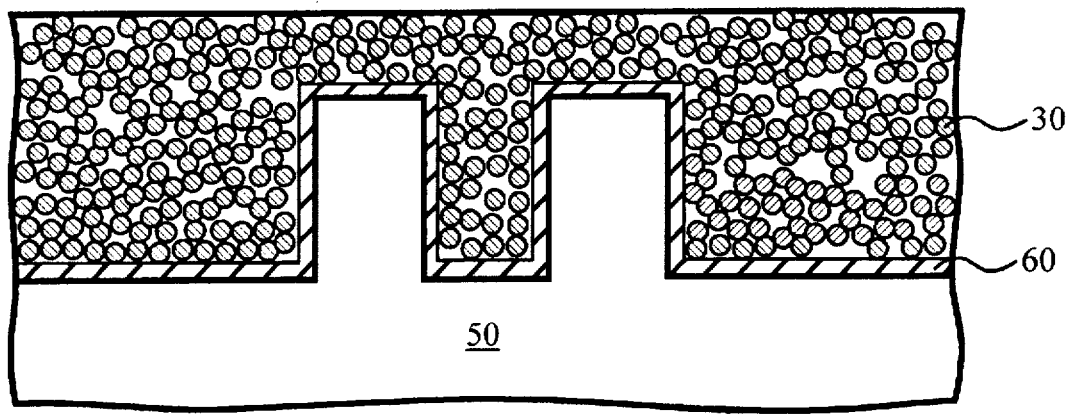
FIG. 4 shows the final application of the nanospheres formed by the methods of this invention as a dielectric layer in a typical semiconductor device.

The solution of nanospheres is then applied to the treated wafer through any of several methods common to the art, including spin coating, spray coating, or dip coating. The deposition method chosen would preferably deposit a dried film with a thickness between 0.1 and 2.0 µm, and more preferably between 0.5 and 1.5 µm, and still more preferably between 0.8 and 1.2 µm. The degree of crystalline order is controlled by the initial concentration of the nanosphere solution, the evaporation rate of the solvents, the temperature of the deposition and other physical variables. The degree of crystallinity is critical to determining the final dielectric constant of the layer. FIG. 2A shows the theoretical maximum packing density for uniform spheres, where 30 represents individual coated spheres. This corresponds to a porosity of ~25%, which would reduce the overall dielectric constant a similar amount. FIG. 2B shows the effect of a 20% vacancy defect of spheres, 30, on the overall porosity of the film, which would decrease the dielectric constant by an additional 20%. FIG. 2C shows the effect of the addition of a small number of spheres, 40, with a varying size distribution on the porosity of the film. Either of these methods for introducing disorder into the film (preferably in combination with variations in the coating/core ratio of the nanospheres) to achieve the desired dielectric constant of the film. FIG. 4 shows the application of a nanosphere film, comprised of coated spheres, 30, to a patterned semiconductor wafer where 50 represents the wafer substrate, and 60 represents the monolayer coating of coupling agent (not to scale).

The final process step in the present invention is an optional curing procedure. If it is desired to enhance the mechanical properties of the deposited film, one, or more of several method may be used to initiate crosslinking and bonding of the nanospheres thought the fluorocarbon coating. The preferred method of curing initiates ionization of the fluorocarbon chains which then convert into a crosslinked glassy phase. The length and intensity of this treatment determines the extent of conversion of the fluorocarbon layer. For example, treatment of a pellet made from dried nanosphere powder at 450° C. under a nitrogen atmosphere for one hour converts the fluorocarbon coating into a glassy phase with the composition $CF_x$. This process also binds the powder compact into an integral shape capable of withstanding considerable mechanical stress. The curing process is not limited to thermal treatment, but may also involve various types of radiative, photonic, electron beam treatment, or a combination of these.

The effectiveness of this curing process will be, in part, determined by the contact area between individual nanospheres in the dried film. This can be enhanced by adding a small amount of monomeric compounds, similar to the coating of the sphere, to the original nanosphere solution. This component will concentrate at the junction of individual particles when the film is dried. The presence of monomer at the interparticle neck will strengthen this area during the curing process. Various fluorinated compound may be used including, but not limited to perfluoroalkanes $(F(CF_2)_nF$, n=10–20), perfluoralcohols $(HO(CF_2)_nF$, n=8–20), perfluorodiols $(HO(CF_2)_nOH$, n=6–20), or perfluorocarboxylic acids, $(HOOC(CF_2)_nF$, n=6–10).

EXAMPLES

The following non-limiting examples show how experimental conditions affect key properties of the nanospheres and dielectric films of nanospheres prepared according to the methods described hereinabove.

In the preferred embodiment of this invention fluorocarbon-coated silica nanospheres with a diameter of 10 nm, were prepared by the following procedure was used. A mixture of 100 mL of acetone, 3.22 grams of TEOS, 1.39 grams of water, and 2.27 mL of 30% aqueous ammonia were mixed and stirred at 25° C. for 30 minutes. After which, 1.395 grams of $(CH_3CH_2O)_3SiCH_2CH_2(CF_2)_nF$, where n=6 (20%), 8 (40%), and 10 (20%), in 50 mL acetone was added and the mixture stirred for 18 hours. At this point, 90 mg of perfluoroheptanoic acid was added to the solution. Evaporating all solvents from this solution and heating at 120° C. for two hours gave a fine white powder that was hydrophobic and possessed a specific surface area of 150 m²/g (corresponding to a particle diameter of 15 nm for spheres with a density of ~2 g/cm³). Pellets pressed at 5000 psi from these powders showed a dielectric constant of 1.95 (assumed porosity of 25%).

An alternate preparation of coated nanospheres is accomplished by mixing 1.3 grams of pre-condensed TEOS ("Silbond H-5" Silbond, Corp.), 0.62 grams of $(CH_3CH_2O)_3SiCH_2CH_2(CF_2)_nF$, where n=6 (20%), 8 (40%), and 10 (20%), 0.06 grams of water, 0.01 mL of concentrated HCl, and 180 mL of chloroform. The mixture was exposed to ultrasonic irradiation at 20 kHz in a Branson Ultrasonics cleaning bath for 3 hours. Removal of all solvents gave a fine white hydrophobic powder with a high surface area.

A small amount of the solution prepared according to the preferred embodiment described above was coated onto a patterned silicon wafer. The solution of nanospheres was spin-coated at 500 rpm and the wafer was air dried and baked at 250° C., leaving a thin film of pure nanospheres. The wafer was then heated to 410° C. under a nitrogen atmosphere for 1 hour to permanently cure the film. Electron microscopy revealed that the film was 1.0 micrometers thick and that 0.3 micron gaps were filled with nanospheres.

An additional embodiment comprises a method of forming a porous dielectric within a microelectronic device comprising: providing a solid substrate possessing a layer of patterned conductors, or onto which said patterns will subsequently be placed; providing a first and second solutions of particles and solvent, wherein said particles consist of a ceramic core surrounded by a thin coating of a substantially different material; depositing a first film of said first solution onto said substrate such that gaps between any of said conductors are filled substantially with said solution; drying said film such that said particles form a continuous layer over said substrate; depositing a second film of said second solution onto said substrate; drying said second film such that said particles form a continuous layer over said substrate; and treating the layers such that said particle coatings form crosslinks between adjacent particles and between said particles and said substrate to form a substantially bonded porous dielectric having a dielectric constant less than 3.0, whereby the capacitive coupling and propagation delay of said conductors is substantially reduced compared to solid silicon dioxide; and wherein the sum of the packing density of said particles and the porosity of said layer is equal to one. The second solution contains particles that are substantially smaller that the particles of said first solution, whereby these particles substantially fill the porosity of said first film, and substantially protect said layer from penetration by liquids. The particles of said second solution provide for a substantially dense top layer. The drying of said first film produces a layer with a porosity in the approximate range of 40–80%, while the drying of said second film produces a layer with a porosity substantially lower than that produced by said first film.

The invention is not to be construed as limited to the particular examples described herein, as these are illustrative rather than restrictive. The invention is intended to cover all processes and structures which do not depart from the spirit and scope of the invention. Specifically the use of individual spherical particles that can be deposited and cured onto a substrate for use as an electrical insulator. Properties of some of the specific examples may be combined without deviating from the nature of the invention.

What is claimed is:

1. A method of forming a porous insulator within a microelectronic device comprising:
   (a) providing a solid substrate possessing a layer of patterned conductors, or onto which said patterns will subsequently be placed;
   (b) providing a solution comprising particles and solvent, wherein said particles consist of a ceramic core surrounded by a coating of substantially different material;

(c) depositing a film of said solution onto said substrate such that the gap between any said conductors is filled substantially with said solution;

(d) drying said film such that said particles form a continuous layer over said substrate; and (e) treating the layer such that said particle coatings form crosslinks between adjacent particles and between said particles and said substrate to form a substantially bonded porous dielectric having a dielectric constant less than 3.0, whereby the capacitive coupling and propagation delay of said conductors is substantially reduced compared to solid silicon dioxide, and wherein the sum of the packing density of said particles and the porosity of said layer is equal to one.

2. The method of claim 1, wherein the ceramic core of said particles consists of silicon dioxide.

3. The method of claim 1, wherein the ceramic cores of said particles have diameters in the approximate range of 2 to 100 nm.

4. The method of claim 1, wherein said particle coatings are organic.

5. The method of claim 1, wherein said particle coatings have a thickness in the approximate range of 0.5 to 2 nm.

6. The method of claim 1, wherein said particle coatings possess a high thermal tolerance, whereby allowing said layers to substantially withstand fabrication temperatures in the approximate range of 300°–500° C. encountered in microelectronics production.

7. The method of claim 1, wherein said particle coatings possess a resistance to moisture.

8. The method of claim 1, wherein said particle coatings prevent degradation, coagulation, flocculation, or gelation of said particles.

9. The method of claim 1, wherein said crosslinking treatment is accomplished by:

(a) methods selected from the group consisting of thermal treatment, electron bombardment, and treatment with electromagnetic radiation, or a combination thereof, and (b) mixing an additive with said solution for increasing the crosslinking efficiency of said treatment.

10. The method of claim 1, wherein said substrate is treated with a chemical agent that renders the surface of the substrate hydrophobic prior to deposition of said solution, whereby the adhesion of said particles to said substrate is substantially enhanced.

11. A method of forming a porous insulator with in a microelectronic device comprising:

(a) providing a solid substrate possessing a layer of patterned conductors, or onto which said patterns will subsequently be placed;

(b) providing a first and second solutions of particles and solvent, wherein said particles consist of a ceramic core surrounded by a thin coating of a substantially different material;

(c) depositing a first film of said first solution onto said substrate such that gaps between any of said conductors a filled substantially with said solution;

(d) drying said film such that said particles form a continuous layer over said substrate;

(e) deposing a second film of said second solution onto said substrate;

(f) drying said second film such that said particles form a continuous layer over said substrate; and (g) treating the layers such that said particle coatings form crosslinks between adjacent particles and between said particles and said substrate to form a substantially bonded porous dielectric having a dielectric constant less than 3.0, whereby the capacitive coupling and propagation delay of said conductors is substantially reduced compared to solid silicon dioxide, and wherein the sum of the packing density of said particles and the porosity of said layer is equal to one.

12. The method of claim 11, wherein said drying of said first film produces a layer with a porosity in the approximate range of 40–80% and drying of said second film produces a layer with a porosity substantially lower than that produced by said first film.

13. The method of claim 11, wherein said second solution contains particles that are substantially smaller than the particles of said first solution, whereby these particles substantially fill the porosity of said first film, and substantially protect said layer from penetration by liquids.

14. The method of claim 11, wherein said second solution contains particles which form a substantially dense top layer, and substantially protect said first layer from penetration by liquids.

* * * * *